United States Patent [19]

Hsieh et al.

[11] Patent Number: 5,446,312
[45] Date of Patent: Aug. 29, 1995

[54] VERTICAL-GATE CMOS COMPATIBLE LATERAL BIPOLAR TRANSISTOR

[75] Inventors: Chang-Ming Hsieh; Louis L. G. Hsu, both of Fishkill; Shaw-Ning Mei, Wappingers Falls; Ronald W. Knepper, LaGrangeville; Lawrence F. Wagner, Jr., Fishkill, all of N.Y.

[73] Assignee: International Business Machines Corporation, Armonk, N.Y.

[21] Appl. No.: 264,885

[22] Filed: Jun. 24, 1994

Related U.S. Application Data

[62] Division of Ser. No. 203,129, Feb. 28, 1994, Pat. No. 5,371,022, which is a division of Ser. No. 900,881, Jun. 18, 1992, Pat. No. 5,341,023.

[51] Int. Cl.[6] .................................... H01L 29/70
[52] U.S. Cl. ............................. 257/559; 257/514; 257/556; 257/586
[58] Field of Search ............... 257/588, 559, 563, 556, 257/552, 514, 515, 586

[56] References Cited

U.S. PATENT DOCUMENTS

| | | | |
|---|---|---|---|
| 5,047,823 | 9/1991 | Treitinger et al. | 257/559 |
| 5,101,256 | 3/1992 | Harame et al. | 257/588 |

*Primary Examiner*—Jerome Jackson
*Assistant Examiner*—Nathan Kip Kelley
*Attorney, Agent, or Firm*—Whitham, Curtis, Whitham & McGinn; Harold Huberfeld

[57] ABSTRACT

A transistor with silicon on insulator (SOI) intrinsic base and a collector each formed by a low temperature epitaxial process and each orientated vertically with respect to the (SOI) substrate. The base width can be as narrow as in a conventional vertical transistor. Similarly, the collector width can be precisely controlled.

4 Claims, 5 Drawing Sheets

VERTICAL-GATE CMOS COMPATIBLE LATERAL BIPOLAR TRANSISTOR

This application is a division of co-pending application Ser. No. 08/203,129, filed on Feb. 28, 1994, now U.S. Pat. No. 5,371,022, which is a division of application Ser. No. 07/900,881, filed Jun. 18, 1992, now U.S. Pat. No. 5,341,023.

BACKGROUND OF THE INVENTION

1. Field of the Invention

This invention relates to a bipolar, lateral transistor, and to a method of making such transistors, and more particularly to a novel vertical-base transistor suitable for low-cost, high-speed, large-scale integrated circuits.

2. Description of the Prior Art

Presently, bipolar transistors in wide-spread commercial use have a vertical geometry. However, the well known lateral bipolar transistor is potentially attractive for many applications because the process steps to make a lateral bipolar transistor are relatively simple when compared to a vertical bipolar transistor. However, as compared to state of the art vertical bipolar transistors, prior art lateral bipolar transistor designs have a relatively low current gain, and a relatively slow operating speed due to parasitic capacitance and inherent thick-base width.

SUMMARY OF THE INVENTION

An object of this invention is the provision of a lateral bipolar transistor suitable for low-cost, high-speed large-scale integrated circuits; a lateral bipolar transistor that has a current gain and operating speed comparable with vertical bipolar transistors. A further object of the invention is the provision of a lateral bipolar transistor that is compatible with complementary metal oxide-semiconductor (CMOS) process step.

Briefly, this invention contemplates the provision of a transistor with silicon on insulator (SOI), intrinsic base and a collector each formed respectively by a low temperature epitaxial process step and each orientated vertically with respect to the SOI wafer. The base width of the transistor can be as narrow as the base width in a comparable vertical transistor. Similarly, the collector width can be precisely controlled. It will be appreciated that the doping profile such as emitter, base and collector junction profiles, for this lateral transistor can be the same as that of a vertical transistor; such doping profiles coupled with small parasitic capacitances and series resistance provide performance characteristics comparable to vertical bipolar designs.

BRIEF DESCRIPTION OF THE DRAWINGS

The foregoing and other objects, aspects and advantages will be better understood from the following detailed description of a preferred embodiment of the invention with reference to the drawings, in which:

FIGS. 1–3, 5–7, 9, 10, 11 and 13 are sectional views. FIGS. 4, 8 and 12 are plan views

DETAILED DESCRIPTION OF A PREFERRED EMBODIMENT OF THE INVENTION

Figure 1:
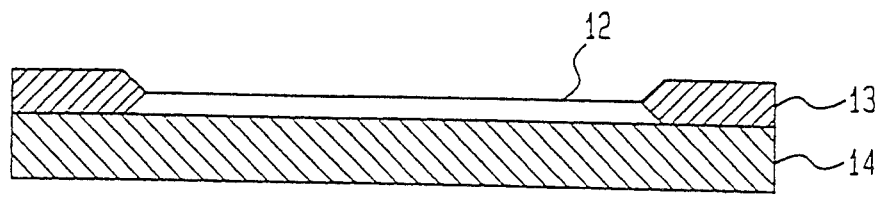
FIGS. 1 through 13 illustrate the process steps and the device state at various steps in fabricating a lateral bipolar transistor in accordance with the teachings of this invention.
Figure 2:
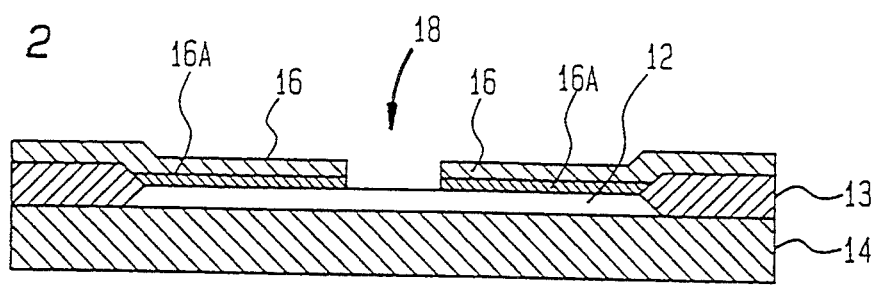

Referring now to the drawings, particularly, FIGS. 1 and 2, a silicon-on-oxide wafer has a thin silicon layer 12 (about 5000 Å thick) on an oxide layer 14 supported by a semiconductor wafer (not shown). At the stage shown in FIG. 1, the silicon layer 12 has been patterned, etched, and a perimeter dielectric 13 formed to make silicon islands for further device fabrication, as is customary in the art. The particular embodiment of the invention described herein is a lateral NPN device. It will be appreciated that a lateral PNP device can be similarly structured and fabricated.

The silicon layer 12 will be the extrinsic base layer of the transistor; in this embodiment of the invention it is a p+ layer with a doping concentration on the order of $5 \times 10^{19}$ atoms/cm$^3$. A thermal oxide 16A, about 300 Å thick, is grown on the exposed area of the silicon layer 12, and a layer of dielectric film (16, about 2500 Å) such as CVD oxide is deposited. A window 18 is opened in the oxide layers 16 and 16A by a suitable etching process (through which window an emitter will be formed by epitaxial lateral overgrowth). FIG. 2 shows the device at this state.

Figure 3:
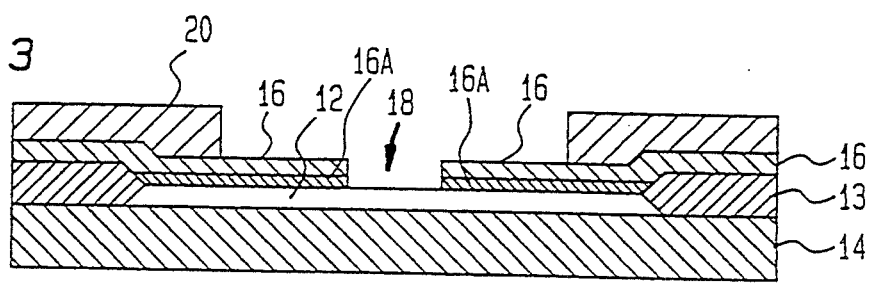

A nitride layer 20 is deposited on the surface of the device, patterned and etched to define the desired emitter boundaries as indicated in FIG. 3.

Figure 4:
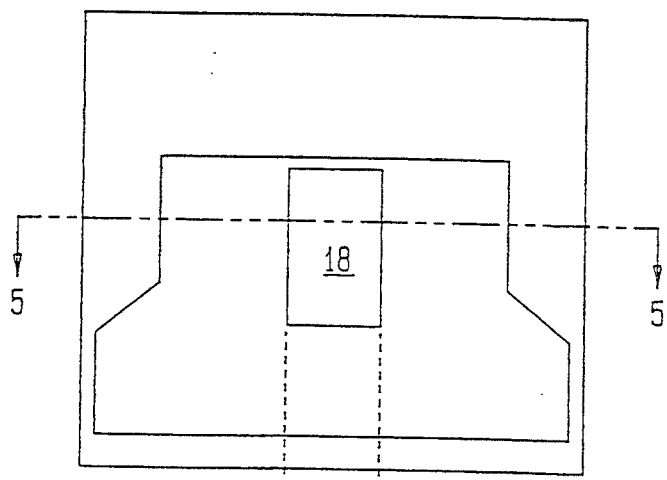
Figure 5:
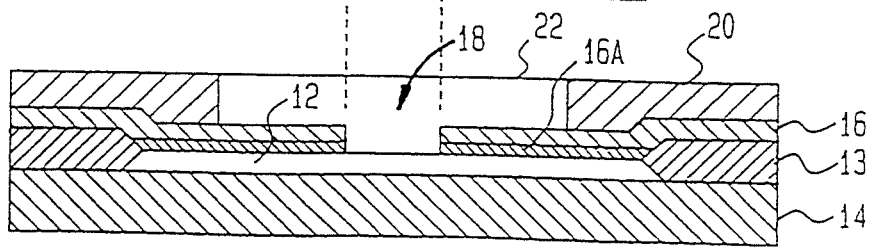

A silicon emitter 22 is then formed by an epitaxial lateral overgrowth through the window 18, with the emitter layer extending up and over the oxide layer 16. The epitaxial later overgrowth process is reviewed in detail in an article entitled "SOI by CVD: Epitaxial Lateral Overgrowth (ELO) Process—Review" by L. Jastrzebski, *Journal of Crystal Growth* 63 (1983), pp. 493–526. The emitter can also be formed by depositing a layer of in situ doped amorphous silicon and recrystallized at 560° C. for five hours using layer 12 through opening 18 as seeding window. The emitter layer 22, shown in FIG. 5, has been chemical-mechanical polished to the thickness of the nitride layer 20 (e.g., about 4000 Å) and has a doping concentration of about $5 \times 10^{20}$ atoms/cm$^3$. A plan view of FIG. 5 is shown in FIG. 4.

Figure 6:
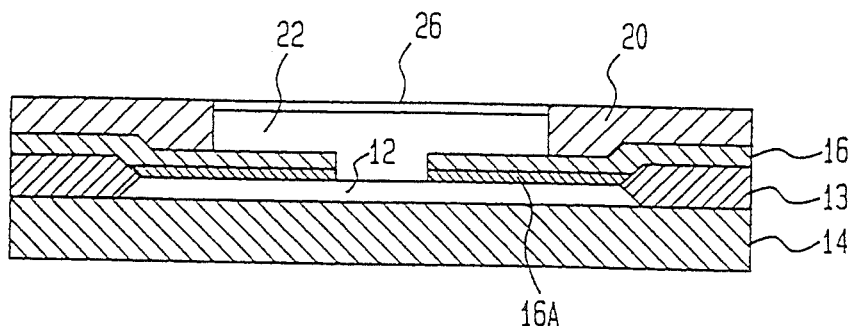
Figure 7:
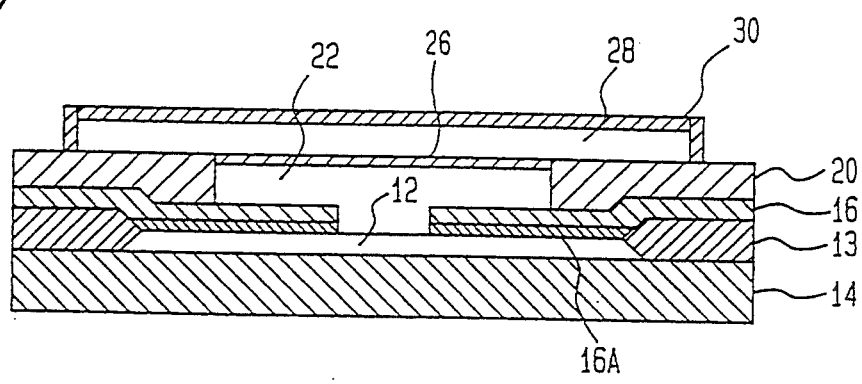

A thermal oxide layer 26, to a depth of about 3000 Å, is then formed on the upper surface of the silicon layer 22, as shown in FIG. 6. Next a layer 28 of p-type polysilicon is formed by a CVD step as a top extrinsic base layer. This top extrinsic base layer reduces the overall base resistance. This polysilicon base layer is then patterned by a dry etch to a size identical to layer 12, the bottom extrinsic base. An oxide 30 about 3000 Å thick is grown by a high-pressure oxide process (HIPOX) on this top extrinsic base layer 28. FIG. 7 shows the device at this state.

Figure 8:
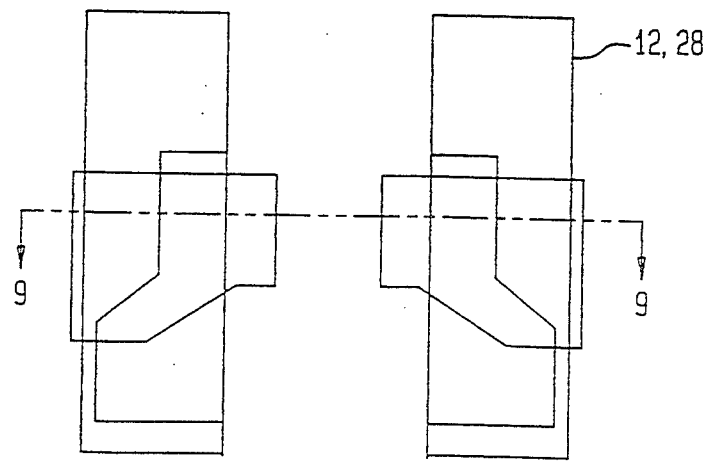
Figure 9:
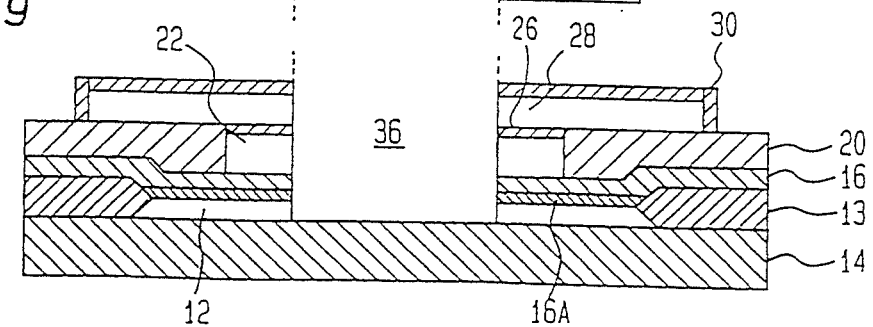

Referring now to FIGS. 8 and 9, an opening 36 is etched. The opening 36 extends through each of the layers (oxide layer 30; top extrinsic base layer 28; oxide layer 26; silicon emitter layer 22; oxide 16; and the silicon layer 12) to the SOI oxide layer 14. This opening separates the silicon island 12 into two identical areas, as best illustrated in the FIG. 8. This separation allows the simultaneous formation of two bipolar transistors.

Figure 10:
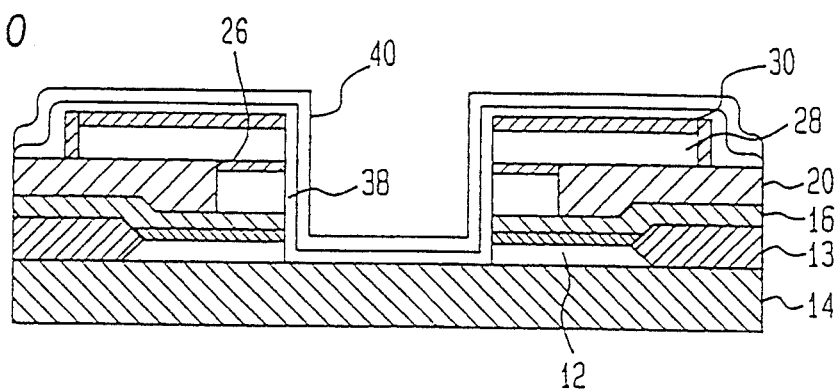

After the opening 36 has been etched, two silicon layers are successively formed, each by a low-temperature epitaxial (LTE) process step. The lower-temperature epitaxial process step is discussed in further detail in an article entitled "Low-temperature Silicon Epitaxy by Ultrahigh Vacuum/Chemical Vapor Deposition" by B. S. Meyerson, *Appl. Phys. Lett.* 48 (12), Mar. 24, 1986, pp. 797–799. The initially formed LTE layer 38 is a p-type layer and is to serve as an intrinsic base. The subsequent LTE layer 40 is a n-type layer and will serve as the collector. FIG. 10 shows the structure with the two LTE layers in place.

Figure 11:
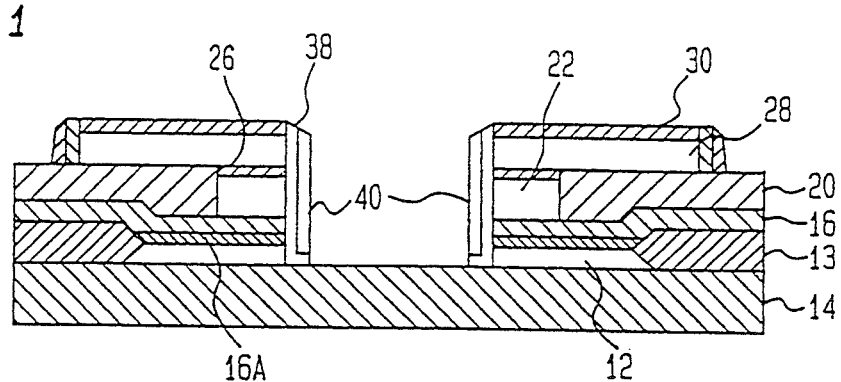

Next, a directional reactive ion etch is used to remove LTE layers 38 and 40 except, for the portions of each layer on the vertical walls of the opening 36, as is shown in FIG. 11. The whole structure is then annealed.

Figure 12:
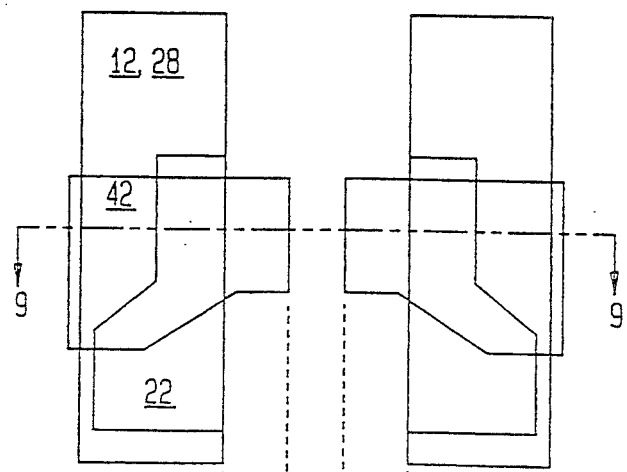
Figure 13:
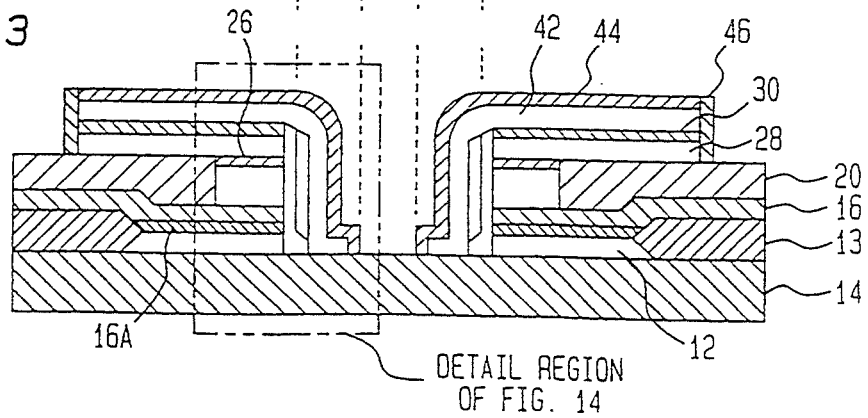
Figure 14:
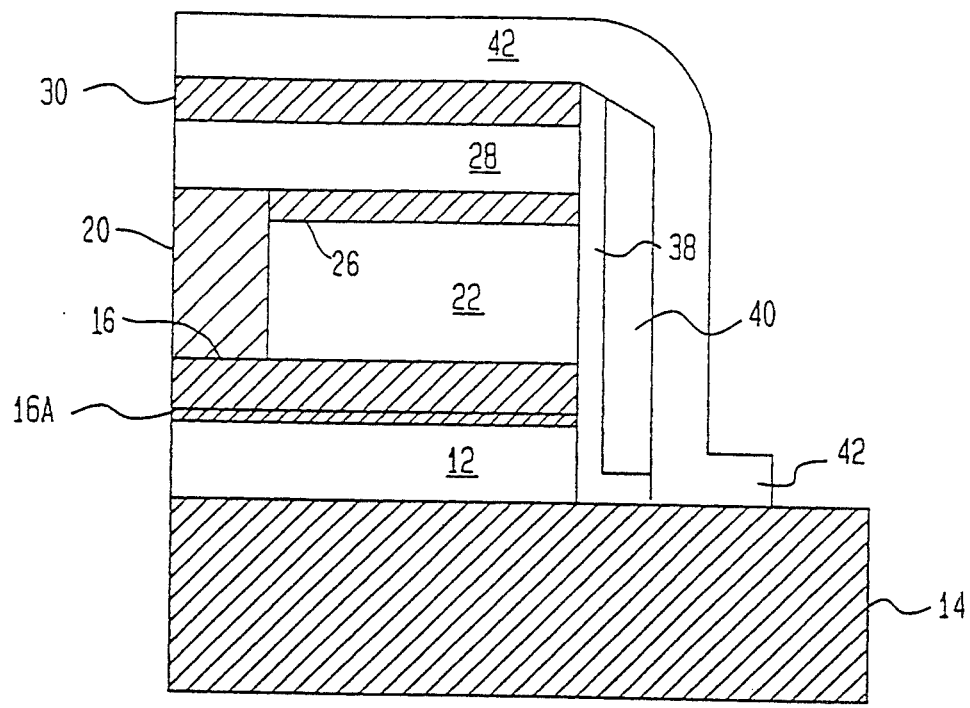
FIG. 14 is an enlarged fragmentary view of FIG. 13.

Referring now to FIGS. 12, 13 and 14, a layer of n+ polysilicon is deposited over the LTE collector layer 40 and forms a collector contact. A PECVD oxide layer 44 is next formed, and the collector region 42 is defined by patterning and etching. The silicon sidewalls are sealed with a HIPOX oxide 46. The plan view and cross-sectional view of the device at this stage is shown in FIGS. 12 and 13, respectively.

Figure 15:
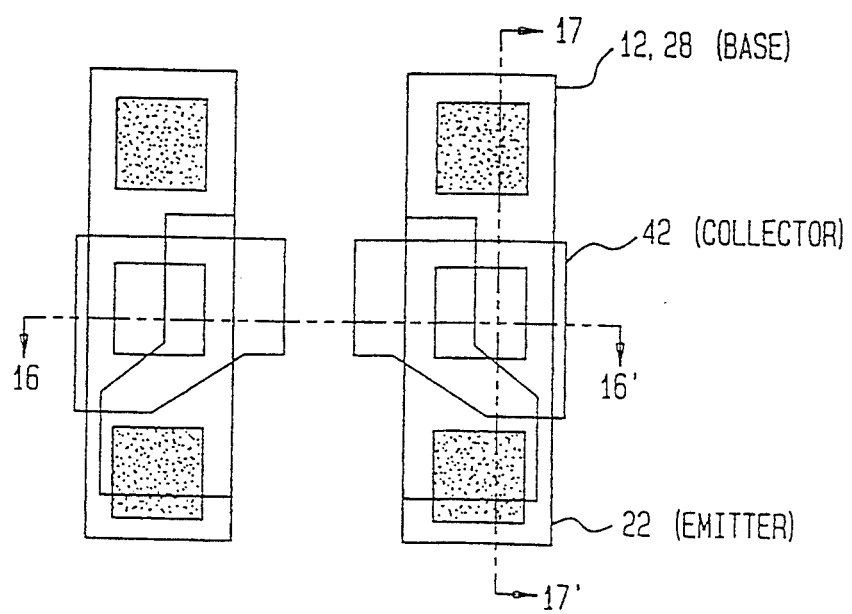
FIG. 15 is a plan view of a completed transistor pair in accordance with the teachings of this invention.
Figure 16:
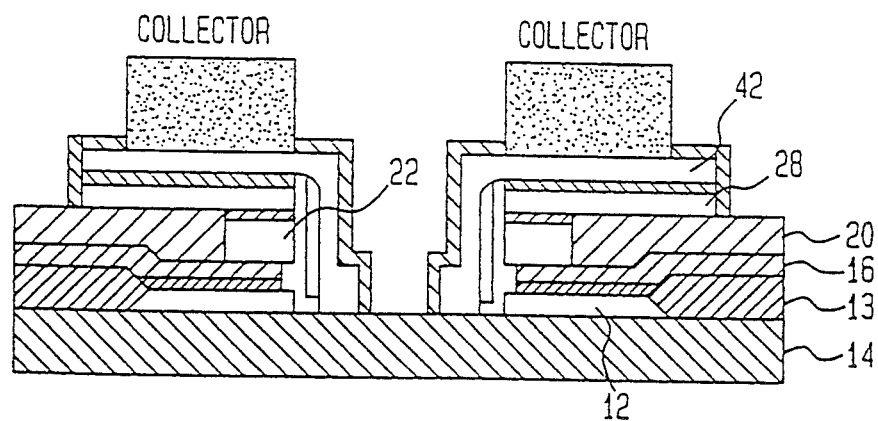
FIG. 16 is a sectional view along the line 16—16' of FIG. 15.
Figure 17:
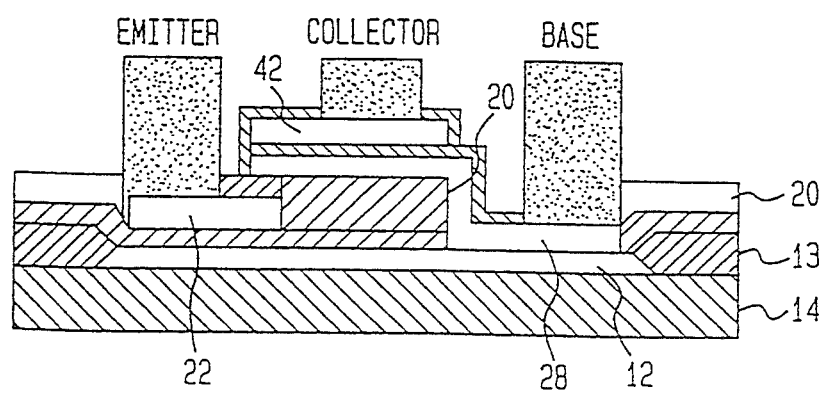
FIG. 17 is a sectional view along the line 17—17' of FIG. 15.

As will be apparent from an inspection of FIGS. 14, 15 and 16, the remaining steps in the fabrication of a lateral bipolar transistor in accordance with the teachings of this invention are conventional, and comprise forming openings in the emitter, base, and collector contact regions, and forming the emitter, base, and collector contacts labeled as such. Conventional process steps are used for fabrication of these contacts.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A pair of bipolar transistors, comprising in combination:
   an extrinsic base layer;
   an emitter layer overlying said extrinsic base layer;
   a vertical opening extending through said extrinsic base layer and said emitter layer forming facing first and second vertical walls;
   an intrinsic base layer formed simultaneously on said first and second vertical walls by a low temperature epitaxial process;
   a collector layer formed simultaneously over said intrinsic base layer on said first and second vertical walls by a low temperature epitaxial process;
   whereby the intrinsic base layer and the collector layer on said first vertical wall, in combination with the extrinsic base layer and emitter layer that form the first vertical wall, comprise one transistor of said pair, and the intrinsic base layer and the collector layer on said second vertical wall, in combination with the extrinsic base layer and emitter layer that form second vertical wall, comprise the other transistor of said pair.

2. A pair of bipolar transistors as in claim 1, wherein said emitter layer is formed by recrystallization of amorphous silicon.

3. A pair of bipolar transistors as in claim 1, wherein said emitter layer is formed by epitaxial overgrowth.

4. A pair of bipolar transistors as in claim 1, further comprising a base contact, an emitter contact, and a collector contact for said one transistor of said pair, and a base contact, an emitter contact, and a collector contact for said other transistor of said pair, said base contact, said emitter contact, and said collector contact from said one transistor of said pair aligned along first axis, and said base contact, said emitter contact, and said collector contact for said other transistor of said pair aligned along a second axis parallel to said first axis.

* * * * *